United States Patent [19]

Anschel

[11] Patent Number: 5,372,685
[45] Date of Patent: Dec. 13, 1994

[54] PROCESS FOR COATING A SUBSTRATE WITH METALLIC LAYER

[75] Inventor: Morris Anschel, Binghamton, N.Y.

[73] Assignee: International Business Machines Corporation, Armonk, N.Y.

[21] Appl. No.: 762,466

[22] Filed: Sep. 19, 1991

Related U.S. Application Data

[63] Continuation of Ser. No. 215,847, Jul. 6, 1988, abandoned.

[51] Int. Cl.$^5$ ............................................. C23C 14/34
[52] U.S. Cl. ........................ 204/192.14; 204/192.15; 204/192.17
[58] Field of Search ...................... 204/192.14, 192.15, 204/192.17

[56] References Cited

U.S. PATENT DOCUMENTS

| | | | |
|---|---|---|---|
| 4,342,632 | 8/1982 | Heim et al. | 204/192.15 |
| 4,351,704 | 9/1982 | Kurihara | 204/15 |
| 4,386,116 | 5/1983 | Nair et al. | 427/99 |
| 4,517,051 | 5/1985 | Gazdik et al. | 156/44 |
| 4,629,662 | 12/1986 | Brownlow et al. | 428/432 |

Primary Examiner—John Niebling
Assistant Examiner—William T. Leader
Attorney, Agent, or Firm—Pollock, Vande Sande & Priddy

[57] ABSTRACT

A metallic layer is coated onto a substrate by sputtering a layer of chromium followed by a layer of copper whereby the temperature of the substrate is at least about 320° C.

13 Claims, No Drawings

PROCESS FOR COATING A SUBSTRATE WITH METALLIC LAYER

This is a continuation of Ser. No. 07/215,847, filed on Jul. 6, 1988, now abandoned.

TECHNICAL FIELD

The present invention is concerned with coating a substrate with a metallic layer and particularly is concerned with providing a layer of chromium followed by a layer of copper on the substrate.

The present invention finds special applicability in the fabrication of metallized integrated circuit substrates.

BACKGROUND ART

In the fabrication of metallized integrated circuit substrates, various inorganic substrates such as ceramics and glass-ceramics, and organic substrates such as polyepoxides and polyimides are coated with metallic layers such as chromium and copper. For example, in the packaging of semiconductor chips, polyimide films are often coated onto substrates.

One configuration for fabricating multilayer substrates for mounting chips employs an insulating substrate of a ceramic material onto which is deposited a pattern of metallic conductors. Usually, the conductors are three layers of metal, being a layer of chromium, followed by a layer of copper, followed by an overlying layer of chromium. On top of the metallized ceramic substrate is placed a layer or film of a polyimide and on top of the polyimide a second layer of a pattern of conductors such as chromium-copper-chromium is provided.

Adhesion between the chromium and dielectric layers has not been entirely satisfactory and has been the subject of research with a view towards enhanced adhesion. For instance, it has been suggested in U.S. Pat. No. 4,386,116 to Nair, et al. and assigned to International Business Machines Corporation, the assignee of the present application, disclosure of which is incorporated herein by reference, to have copper as the metal contacting polyimide on the second or subsequent layers. The copper also contacts the copper top layer of the first layer at the base of the vias in the polyimide, the top chromium having been removed at those locations.

For instance, it is necessary to electrically contact some of the conductors in the upper or second layer of metallization to some of the conductors on the lower or first layer of metallization. In order to do so, the polyimide must be selectively etched to form the desired vias therein to allow for metal connection between the upper and lower levels of metallization.

However, the adhesion between the copper and polyimide is not entirely satisfactory and could stand a degree of improvement. In particular, problems have occurred at the copper-polyimide interface resulting in lifting up of the copper line from the underlying polyimide substrate rendering the carrier unsuitable for its intended purpose.

Another use would be as a dielectric and/or circuit carrier for flexible circuits. This would involve, for example, spray coating or roller coating polyamic acid onto a sheet of metal such as stainless steel, copper, copper-metal composite such as copper-clad Invar (a trademark of International Nickel Company), or aluminum. The film is then thermally cured or imidized, resulting in a film which is fully or substantially fully thermally cured. The metal which the polyimide is on can be imaged, removed, or maintained. On top of the polyimide, three layers of metal are deposited such as by either evaporation or sputtering. The conductors are chromium or nickel, followed by a layer of copper, followed by a layer of chromium or nickel. By means of photolithographic operations, this metal is imaged into circuits. Depending on the use of the circuit, the polyimide may or may not be imaged either before or after the formation of the circuit.

Accordingly, the importance of improving the adhesion between such substrates and the metallic layers cannot be overemphasized.

SUMMARY OF INVENTION

The present invention is concerned with improving the adhesion of chromium layer followed by copper on a dielectric substrate.

In particular, according to the present invention, the adhesion between the dielectric layer and chromium-copper layers is enhanced by depositing the chromium and copper by sputtering and by maintaining the temperature of the dielectric substrate at a minimum of about 320° C.

BEST AND VARIOUS MODES FOR CARRYING OUT THE INVENTION

The dielectric substrate that can be coated in accordance with the present invention can be organic substrates or inorganic substrates and include ceramics, glass-ceramics, synthetic polymers such as polyimides, polyimide precursors, and polyepoxides. Also, the substrates can be relatively rigid or flexible.

The ceramics are well-known and need not be described in any great detail and include such materials as aluminum oxides, silicon oxides, silicates such as aluminum silicate, and mixtures of these materials.

The polyimides used as substrates in accordance with the present invention include unmodified polyimides, as well as modified polyimides such as polyester imides, polyamide-imide-esters, polyamide-imides, polysiloxaneimides, as well as other mixed polyimides. Such are well-known in the prior art and need not be described in any great detail.

Generally, the polyimides include the following recurring unit:

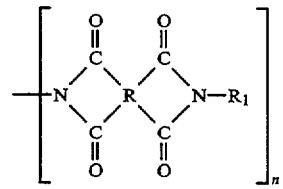

where n is an integer representing the number of repeating units to provide a molecular weight usually about 10,000 to about 100,000. R is at least one tetravalent organic radical selected from the group consisting of:

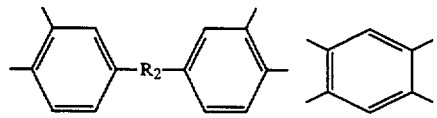

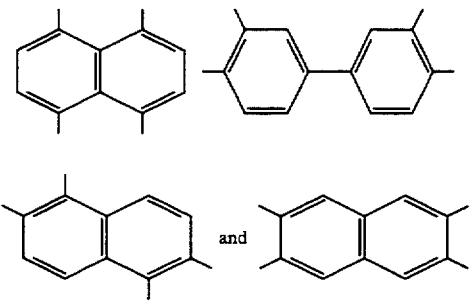

$R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

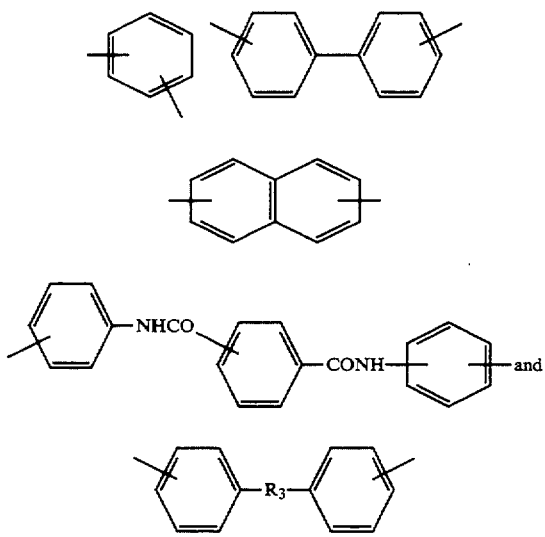

in which $R_3$ is a divalent organic radical selected from the group consisting of R2, silicon, and amino radicals. Polymers containing two or more of the R and/or $R_1$ radicals, especially multiple series of $R_1$ containing amido radicals, can be used.

Commercially available polyimide precursors (polyamic acid) are various polyimide precursors from DuPont and available under the trade designation Pyralin. These polyimide precursors come in many grades, including those available Pyralin polyimide precursors from DuPont under the further trade designations PI-2555, PI-2545, PI-2560, PI-5878, PIH-61454, and PI-2540. Some of these are Pyromelletic Dianhydride-Oxydianiline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with an anhydride curing agent such as acetic anhydride.

In order to achieve the significantly improved adhesion obtained by the present invention, it is necessary that the layer contacting the dielectric substrate be chromium and that it be deposited by sputtering. In addition, the temperature of the substrate during the sputter deposition of the chromium, as well as the subsequently to be applied copper layer, must be at least about 320° C., preferably at least about 350° C., and most preferably about 360° C. to about 390° C. For polyimide substrates, it is preferred that the temperature not exceed about 390° C.; whereas, for ceramic substrates, the maximum temperature is about 400° C.

The sputtering technique as contrasted to evaporation actually results in heating up the substrates to some extent, depending upon the thickness of the metal layer deposited.

The impingement of the sputtered particles onto the substrate is believed to cause a localized temperature increase of the substrate and, in the case of the present invention, can increase it up to about 40° C. or more, depending upon the thickness of the sputtered metal layers. The remainder of the heat into the substrate can be provided by resistive heating coils. Although it was previously attempted in certain products over a year or so ago to provide a thin layer of chromium (usually about 50 angstroms) and layer of copper (usually about 80,000 angstroms) on polyimides anchored on metallized ceramics using evaporation techniques and temperatures of about 300° C.–350° C., the degree of adhesion was still less than desired.

The heating caused by the present invention is advantageous since the bulk of the substrate other than the localized areas where the sputtering is occurring at any particular time can be at a lower temperature.

The chromium layer is usually about 100 angstroms to about 600 angstroms and preferably about 200 angstroms to about 400 angstroms.

It is believed that the use of the above temperatures results in improved adhesion due to formation of a strong bond between the chromium and oxide of the substrate surface. Also, it is believed that the use of the temperatures required by the present invention assists in removing contaminants from the substrate surface that can adversely effect the adhesion. For example, loss of adhesion in the past has occurred due to failure stress induced by water, outgassing such as $CO_2$ from, for example, inorganic carbonates and/or residual carbon from the substrate binder and plasticizers in organic substrate leading to relatively weak bonds.

In addition, as contrasted with the tenacious chromium oxide bond achieved by the present invention, the deposition of chromium on substrates at lower temperatures than required by the present invention possibly tend to form peroxide bonds at the substrate chromium interface. However, these peroxide bonds are relatively unstable and weak as compared to the oxide bonds achieved by the present invention.

After the chromium is sputter-coated onto the substrate, a copper layer is sputtered onto the chromium layer while maintaining the temperature of the substrate at a minimum of about 320° C., preferably at least about 350° C., and most preferably at about 360° C. to about 390° C.

The copper layer is usually employed in thicknesses of about 40,000 angstroms to about 80,000 angstroms.

According to preferred aspects of the present invention, a second layer of chromium is sputtered onto the copper layer while maintaining the substrate temperature at a minimum of about 320° C., preferably at least about 350° C., and most preferably about 360° C. to about 390° C.

The second chromium-layer is usually about 600 angstroms to about 950 angstroms and preferably about 800 angstroms.

The actual sputter apparatus to employ are well-known and need not be discussed in any detail herein. For instance, see Microelectronic Manufacturing and Testing, Selection Guide: Sputtering Equipment, November 1987, pp. 1 and 19-22. In general, sputtering is conducted in a vacuum environment with noble gas ions such as argon being accelerated by an electric field. The resulting high-speed positive ions are then impacted on a suitable cathode target which, in the case of the present invention, is copper and chromium. Due to the kinetic energy of the positive ions, atoms or molecules are blasted from the surface of the target material. These sputtered particles are then deposited on the desired substrate portion in the apparatus.

There are generally three basic types of sputtering techniques. In the diode mode, the target material is attached to a cathode and the substrate upon which a sputtered film is to be deposited is placed on the anode. The triode mode is similar to the diode mode, except that it also includes a hot filament. This filament generates a high-density plasma that is independent of the excitation of the target. In the magnetron mode a magnetic field is used to increase the distance which the electrons travel.

The following non-limiting examples are presented to further illustrate the present invention:

EXAMPLE 1

To a 44 mm square pin grid array package consisting of a standard 96% alumina ceramic, a ground/voltage plane which is isolated with a glass/ceramic dielectric coating with interconnections made through photo-patterned vias in the dielectric material is sputter deposited using the magnetron mode with DC excitation about 250±150 angstroms chromium, followed by about 78,000 to about 80,000 angstroms copper, followed by about 800 angstroms chromium. The rate of deposition of the films is about 10 angstroms/second with the temperature of the substrate where deposition is occurring being about 350° C.±5° C. for the first chromium film; about 380° C.±5° C. for the copper, and about 350° C. ±5° C. for the second chromium filter. The temperature of the substrate is raised significantly during the copper deposition due to the impingement of the thicker copper being sputtered.

The sputtered chromium/copper/chromium thin film layers are patterned using conventional photolithography and integrated circuit chips are attached using standard solder techniques. The integrity of the thick film/thin film package is determined by a tensile chip pull adhesion test. A stud is mounted to the back surface of the chip and the chip is pulled at 90° from the package.

Typical chip pull values obtained are about 3,361 to 5,468 psi.

EXAMPLE 2

To a free-standing polyimide film is sputter deposited about 300 angstroms of chromium, followed by about 3,000 angstroms of copper, using the magnetron mode with DC excitation at a rate of deposition of about 10 angstroms/second.

The temperature of the substrate where deposition is occurring is about 350° C.±5° C. for the chromium and for the copper. Next, copper is electroplated onto the structure using a standard acid electroplate to provide an additional about 76,200 angstroms of copper. The chromium/copper is circuitized using conventional photolithography followed by a light dip (i.e., 10% sulfuric acid soak for one minute, rinsed with deionized water, and alcohol dried) treatment to remove oxides of copper prior to a standard gold electroplate deposition to a thickness of about 7,620 angstroms.

EXAMPLE 3

A polyimide film is anchored onto a ceramic substrate by prebaking at about 400° C. for about 30 minutes in a vacuum. Using the magnetron sputter mode with DC excitation is sputter deposited about 250 angstroms of chromium, followed by about 80,000 angstroms of copper, followed by about 800 angstroms of a second chromium layer. The rate of deposition is about 10 angstroms/second with the temperature of the polyimide substrate where deposition is occurring being about 350° C.±5° C. for the first chromium layer; about 380° C.±5° C. for the copper layer, and about 350° C.±5° C. for the second chromium layer.

The metallurgy is patterned by conventional photolithographic means. The processed parts are then characterized for adhesion using a standard 90° tensile peel with yielding values of about 35–50 g/mm.

Having thus described my invention, what I claim as new and desire to secure by Letters Patent is:

1. A process for providing a metallic layer on a dielectric substrate which consists essentially of providing a dielectric substrate wherein said dielectric substrate is a polyimide, sputter-coating a layer of chromium, followed by sputter-coating a layer of copper on said dielectric substrate wherein the temperature of said substrate is at least about 320° C. where the sputter-coating of the chromium and copper is occurring and wherein said chromium contacts said dielectric substrate.

2. The process of claim 1 wherein said temperature of said substrate is at least about 350° C.

3. The process of claim 1 wherein said temperature of said substrate is about 360° C. to about 390° C.

4. The process of claim 1 wherein the temperature of said substrate is up to about 390° C.

5. The process of claim 1 wherein said layer of chromium is about 100 angstroms to about 600 angstroms thick.

6. The process of claim 1 wherein said layer of chromium is about 200 angstroms to about 400 angstroms thick.

7. The process of claim 1 wherein said layer of copper is about 40,000 angstroms to about 80,0,00 angstroms thick.

8. The process of claim 1 which further includes sputter-coating a second layer of chromium onto said copper while the temperature of the substrate is at least about 320° C.

9. The process of claim 8 wherein the temperature of said substrate is at least about 350° C.

10. The process of claim 8 wherein the temperature of said substrate is about 360° C. to about 390° C.

11. The process of claim 8 wherein said second layer of chromium is about 600 angstroms to about 950 angstroms thick.

12. The process of claim 8 wherein said second layer of chromium is about 800 angstroms thick.

13. A process for providing a metallic layer on a dielectric substrate which consists of providing a dielectric substrate wherein said dielectric substrate is a polyimide, sputter-coating a layer of chromium, followed by sputter-coating a layer of copper on said dielectric substrate wherein the temperature of said substrate is at least about 320° C. where the sputter-coating of the chromium and copper is occurring and wherein said chromium contacts said dielectric substrate.

* * * * *